United States Patent [19]
Chu et al.

[11] Patent Number: 5,856,937
[45] Date of Patent: Jan. 5, 1999

[54] PROCESSOR MODULE WITH DUAL-BANK SRAM CACHE HAVING SHARED CAPACITORS AND R-C ELEMENTS INTEGRATED INTO THE MODULE SUBSTRATE

[75] Inventors: Tzu-Yih Chu, San Jose; Abraham C. Ma, Union City, both of Calif.

[73] Assignee: MA Laboratories, Inc., San Jose, Calif.

[21] Appl. No.: 876,135

[22] Filed: Jun. 23, 1997

Related U.S. Application Data

[63] Continuation-in-part of Ser. No. 755,546, Nov. 22, 1996.
[51] Int. Cl.$^6$ ........................................................ G11C 5/02
[52] U.S. Cl. ................................. 365/51; 365/52; 365/63; 365/226; 365/228; 365/193; 257/780; 257/532
[58] Field of Search ................................. 365/51, 52, 63, 365/226, 228, 193; 257/780, 781, 778, 532

[56] References Cited

U.S. PATENT DOCUMENTS

| | | | |
|---|---|---|---|
| 4,727,513 | 2/1988 | Clayton | 365/52 |
| 5,307,309 | 4/1994 | Protigal et al. | 365/63 |
| 5,347,258 | 9/1994 | Howard et al. | 338/333 |
| 5,504,373 | 4/1996 | Oh et al. | 257/734 |
| 5,654,929 | 8/1997 | Mote, Jr. | 365/222 |

OTHER PUBLICATIONS

"Pentium Part II", C. Metz, PC Magazine, Jun. 10, 1997, pp. 101–104.

*Primary Examiner*—David Nelms
*Assistant Examiner*—Andrew Q. Tran
*Attorney, Agent, or Firm*—Stuart T. Auvinen

[57] ABSTRACT

A processor module has a cache of SRAM chips mounted on both a back and a front surface but de-coupling capacitors mounted on only the back surface. Each de-coupling capacitor is for suppressing current spikes from a pair of SRAM chips. The pair of SRAM chips includes a first SRAM chip on the same surface as the capacitor and a second SRAM chip opposite the first SRAM chip on the front surface of the module. The first SRAM chip belongs to a first bank while the second SRAM chip belongs to a second bank. Two chip-enable signals control access to the two banks. Since only one bank is accessed at any time, and access causes current spikes, only one bank and only one SRAM chip in the pair of SRAM chips creates a current spike at any time. Thus, a capacitor can be shared between the two SRAM chips in the pair. The shared capacitor can be mounted next to or under one of the SRAM chips, or formed within the multi-layer substrate itself. Having capacitors on only one of the surfaces reduces the number of placement sequences required, reducing manufacturing cost. The capacitors are mounted on the opposite surface from the large processor for efficiency.

21 Claims, 4 Drawing Sheets

FRONT SIDE

BACK SIDE

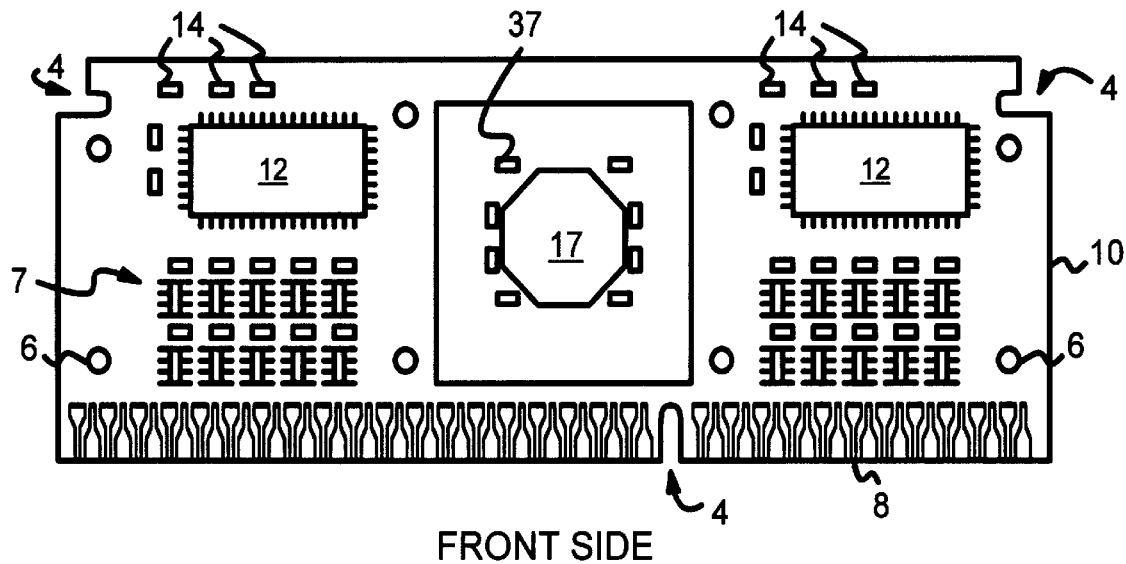
FIG. 1    PRIOR ART
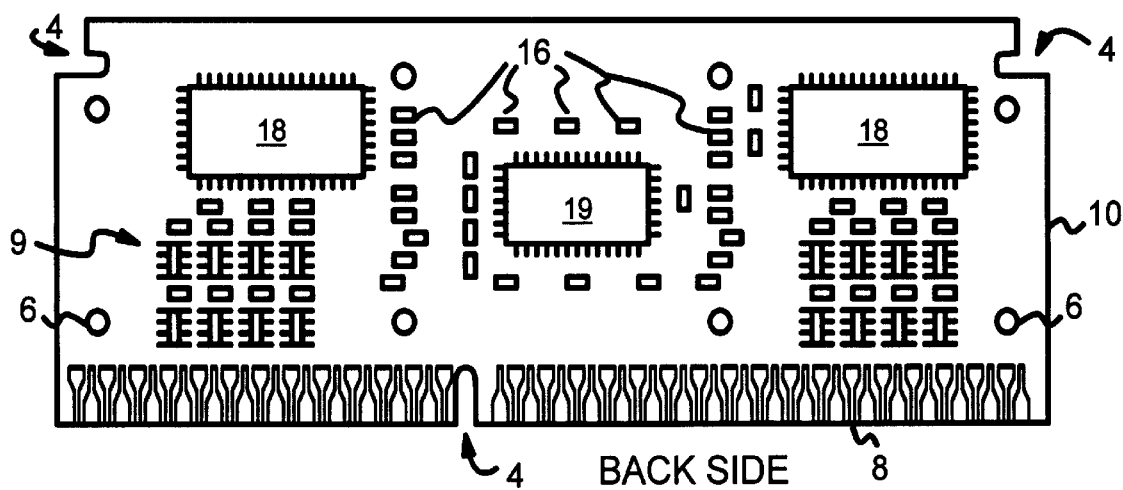

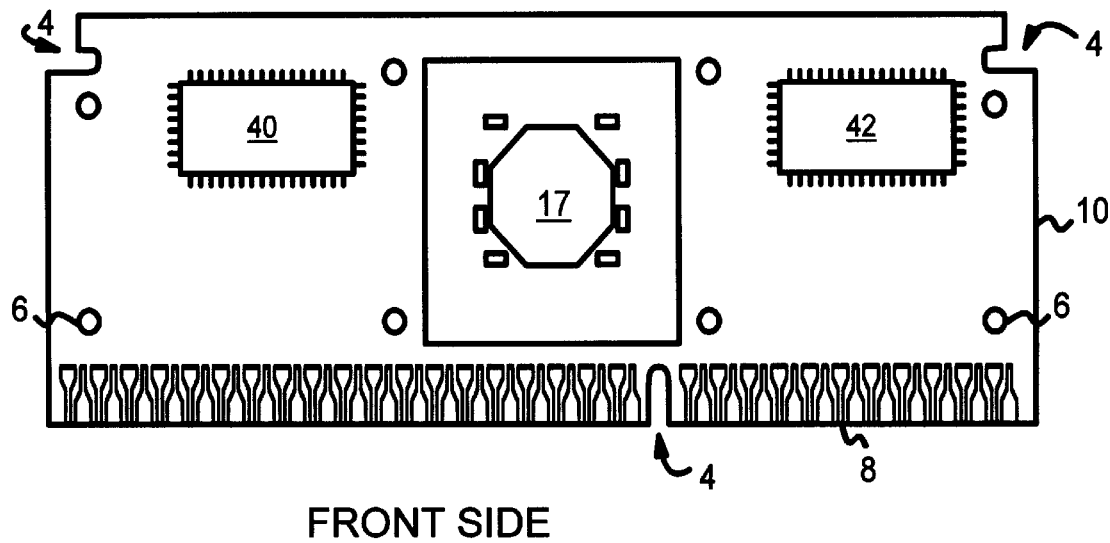
FRONT SIDE
FIG. 2
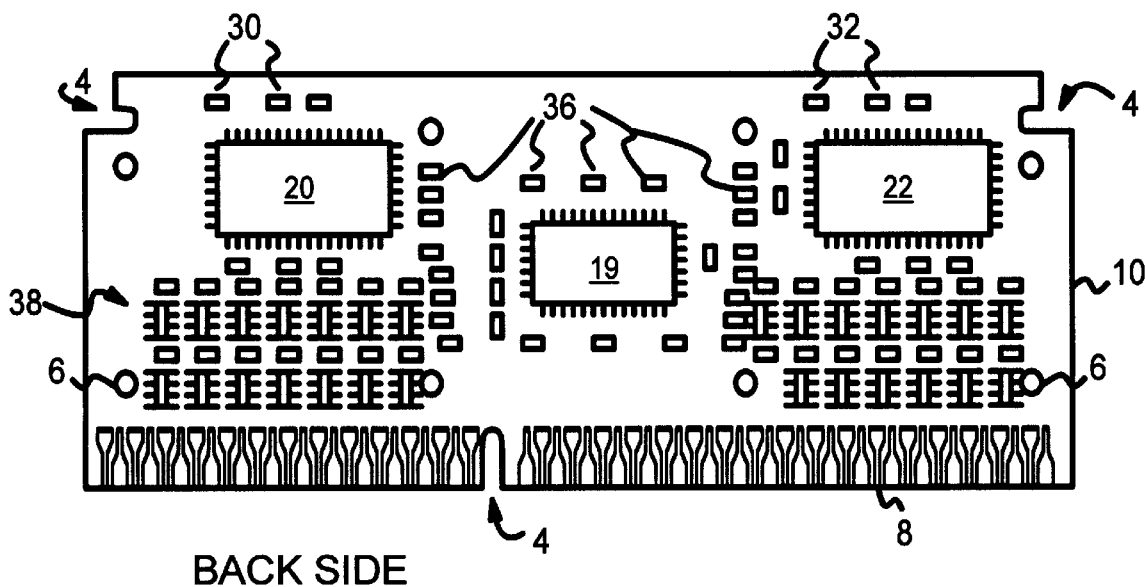
BACK SIDE

PROCESSOR MODULE WITH DUAL-BANK SRAM CACHE HAVING SHARED CAPACITORS AND R-C ELEMENTS INTEGRATED INTO THE MODULE SUBSTRATE

RELATED APPLICATION

This application is a continuation-in-part of the co-pending application for "Dual-Bank Memory Module with Shared Capacitors and R-C Elements Integrated into the Module Substrate", U.S. Ser. No. 08/755,546, filed Nov. 22, 1996.

BACKGROUND OF THE INVENTION

1. Field of the Invention

This invention relates to processor and memory modules, and more particularly for modules and production methods to reduce the cost of CPU/SRAM modules.

2. Description of the Related Art

Memory modules containing dynamic random-access memories (DRAM's) are shipped with most personal computers (PC's) today, allowing for later expansion with additional modules. Occasionally the central processing unit (CPU) or microprocessor is mounted on a small daughter or processor card or module that is inserted into a socket in the PC's motherboard. Using processor modules allow the CPU to be upgraded by replacing the processor card.

These processor modules often include a small cache memory, such as a first or second-level cache. A cache memory reduces memory latency by providing a small storage area for the most-recently-used data and instructions. Locality of instructions and data predicts that the most-recently-used data and instructions are likely to be used again. Since the cache memory is faster than the main DRAM memory, data in the cache is fetched more rapidly than data in the main DRAM memory.

Static RAM chips are used for cache memories. The access delay for SRAM chips is significantly smaller than for DRAM chips, as SRAM chip access delays are currently under 10 nanoseconds, while DRAM access delays are 50 or 60 nanoseconds. SRAM chips are simpler to interface, as they do not require refreshing, as do DRAM chips.

Like memory modules, processor modules are made in many different sizes and capacities, with different numbers of interface pins. The "pins" were originally pins extending from the module's edge, but now most modules are leadless, having metal contact pads or leads. The modules are small in size, being about 3 to 5 inches long and one or two inches high. The modules contain a small printed-circuit board substrate, typically a multi-layer board with alternating laminated layers of fiberglass insulation and foil or metal interconnect layers. Surface mounted components are soldered onto one or both surfaces of the substrate. Static-RAM integrated circuits (IC's) or chips are commonly packaged in inexpensive surface-mount packages such as small-outline J-leaded (SOJ) packages, PLCC's, or small-outline (SO) packages.

The SRAM chips draw significant amounts of current when address signals change and when OE (output enable) is asserted during accessing of the memory. Asserting OE or other control signals, and changing address inputs cause current spikes, which could upset the power and ground potentials on the processor module. Thus, capacitors are often mounted on the substrate near each SRAM chip. The capacitors are connected between power and ground as close as possible to the power and ground pins of each SRAM package. For wide SRAM chips with multiple power and ground pins, several capacitors may be used for each chip.

Capacitors Mounted on Both Surfaces of Module

FIG. 1 is a diagram of a prior-art processor module with SRAM cache. The processor module contains a substrate 10, with surface-mounted SRAM chips 12 mounted to the front surface or side of substrate 10, while more SRAM chips 18 are mounted to the back side or surface of substrate 10. Metal contact pads 8 are positioned along the bottom edge of the module on both front and back surfaces. Metal contact pads 8 mate with pads on a module socket to electrically connect the module to a PC's motherboard. Notch 4 ensures that the module is correctly positioned in the socket.

Processor 17 is a high-speed microprocessor such as a Pentium-II processor manufactured by Intel Corporation of Santa Clara, Calif. Processor 17 is packaged in a large ball-grid-array (BGA) package and has several hundred interconnect solder balls or "pins". Since processor 17 dissipates several dozen Watts of power, a heat sink is necessary. Holes 6 receive pegs holding a large heat sink over the processor module. This heat sink is thermally connected to processor 17 using heat-transfer paste. Substrate 10 is sandwiched between the heat sink and a plastic case and sold by Intel as a single-edge-contact (SEC) cartridge.

Bus controller chip 19 is an interface chip for interfacing processor 17 to an external cache memory of SRAM chips 12, 18. Resistor packs 7, 9 are mounted on the front and back surfaces of module 10 to provide dampening of data-bus signals.

Capacitors 14 are mounted on the front surface of the module near each of SRAM chips 12, while additional capacitors 16 are mounted near each SRAM chip 18 on the back surface of the module. Additional capacitors and resistors are provided on both front and back surfaces. Thus, capacitors are mounted on both the front and back surfaces of the module when SRAM chips are also mounted on both surfaces. These capacitors are surface-mount passive components.

Manufacture Requires Separate Steps for Each Surface

Manufacture of these processor modules involves many steps. The substrate's interconnect layers are patterned and via holes drilled. The larger surface mount SRAM packages and the processor BGA package are wave-soldered or placed and solder-reflowed to one surface, then SRAMs and the interface-chip are soldered to the back surface. Smaller surface-mount components such as capacitors and resistors are also placed on each surface separately from the larger SRAMs, often before the SRAMs are attached.

Components are attached to only one surface of the substrate during any soldering step. Using modem equipment, each attachment of components requires the steps of:

1. Applying a mix of solder and solder paste to only the metal areas that are being attached to components in the current soldering sequence.
2. Placing the desired components onto the solder and solder paste mixtures over the metal attach areas of the substrate.
3. Heating the entire substrate to heat the solder mixture to re-flow the solder and form a solid bond between the metal leads of the desired components and the metal attach areas of the substrate.

This sequence is then repeated for another surface of the substrate, or another set of desired components. The processor BGA package may itself require a separate attachment sequence.

Since passive components such as capacitors and resistors must be placed onto the solder paste separately from the larger SRAM chips, two placement sequences are needed for each surface with both SRAM chips and passive components. Thus, a two-sided processor module requires at least four sequences of placing components. Moving the device-placement nozzle of the high-speed manufacturing machines to place passive components at the various locations requires time on the expensive machine.

What is desired is to reduce the manufacturing cost of a processor module. It is desired to reduce the number of sequences of steps required to mount the components. It is further desired to reduce costs of processor modules with multiple-banks of SRAMs. It is also desired to use passive components embedded into the substrate layers rather than surface-mounted passive components.

SUMMARY OF THE INVENTION

A dual-bank processor module with shared capacitors has a substrate with wiring traces for conducting, signals. The substrate also has power-supply traces and ground traces for connection to a power supply and a ground. A plurality of leads along a bottom edge of the substrate includes a power-supply lead and a ground lead and control leads and data leads. The plurality of leads electrically connect the dual-bank processor module to a system. The module has a processor chip mounted thereon.

A cache memory on the substrate has pairs of SRAM chips each with a first SRAM chip from a first bank and a second SRAM chip from a second bank. Each pair of SRAM chips shares a capacitor coupled between power-supply and ground pins of the first and second SRAM chips. Thus, each pair of SRAM chips share a capacitor.

In further aspects of the invention, all capacitors are mounted on a first surface of the substrate and no capacitors are mounted on a second surface of the substrate. The second surface is opposite the first surface. Each pair of SRAM chips includes the first SRAM chip mounted on the first surface of the substrate and the second SRAM chip mounted on the second surface of the substrate. Thus, the SRAM chips in a pair are mounted on opposite surfaces of the substrate.

In further aspects, the first SRAM chip is mounted opposite the second SRAM chip with an overlapping portion of the second SRAM chip on the second surface. In another aspect, the first SRAM chip is mounted substantially opposite the second SRAM chip in each pair of SRAM chips.

In other aspects, the control leads include a first chip-enable signal and a second chip-enable signal. The first chip-enable signal is connected to all SRAM chips in the first bank but is not connected to any SRAM chips in the second bank, while the second chip-enable signal is connected to all SRAM chips in the second bank and is not connected to any SRAM chips in the first bank. Thus, the first bank and the second bank of SRAMs are separately controlled.

In other aspects the first SRAM chip and the second SRAM chip in the pair of SRAM chips both are coupled to a same data signals. The same data signals are not connected to other SRAM chips in the module. Thus, each pair of SRAM chips is coupled to unique data bits.

BRIEF DESCRIPTION OF THE DRAWINGS

FIG. 1 is a diagram of a prior-art processor module with SRAM cache.

FIG. 2 is a diagram of a processor and cache module with all the capacitors mounted on the back surface.

DETAILED DESCRIPTION

Figure 3:
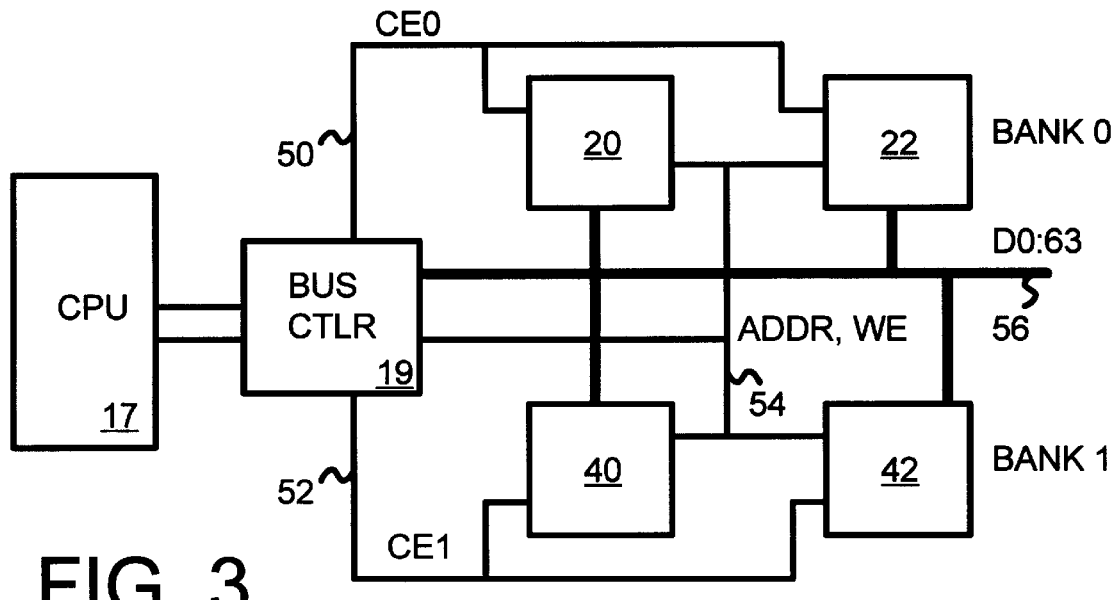
FIG. 3 is a schematic diagram of a dual-bank-cache processor module.

The present invention relates to an improvement in the manufacture of processor modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The parent application showed that significant cost savings result when one of the placement sequences for memory modules is eliminated. The inventors have realized that such cost savings can be applied to more complex processor modules. Separate placement sequences are needed for the SRAM chips and for the smaller capacitors. Components can be placed on only one surface during any one soldering sequence. The number of placement sequences is determined by the grouping of components onto the surfaces of the module's substrate. Changing the grouping of components can reduce the number of placement sequences and thus lower manufacturing cost.

For a module having only one surface, only two placement sequences are needed. Components cannot be re-grouped on the only surface to reduce the number of placement sequences without eliminating the capacitors or the SRAM chips altogether.

The prior art double-sided module required four placement sequences:

1. Placing capacitors on the front surface.
2. Placing SRAM chips and processor BGA package on the front surface.
3. Placing capacitors on the back surface.
4. Placing SRAM and bus-interface chips on the back surface.

Components are thus grouped into four groups for the prior-art module:

1. Capacitors on the front surface.
2. SRAM chips and processor BGA package on the front surface.
3. Capacitors on the back surface.
4. SRAM and bus-interface chips on the back surface.

The inventors have realized that it is not essential for capacitors to be soldered to both the front and back surfaces of the module. Thus, the inventors group components into only three groups:

1. SRAM chips and processor BGA package on the front surface.
2. Capacitors on the back surface.
3. SRAM and bus-interface chips on the back surface.

Only three simplified placement sequences are needed:

1. Place capacitors onto the back surface.
2. Place SRAM chips and processor BGA package onto the front surface.
3. Place SRAM and bus-interface chips onto the back surface.

The inventors have found that about one second per memory module can be saved by placing all capacitors on one surface rather than one two surfaces. This is a significant saving due to the high cost of modern manufacturing equipment that operates at a very high speed. Since processor modules also employ many capacitors, a similar time savings can result.

The capacitors soldered to the front surface could be placed and soldered to the back surface instead of the front surface to keep the number of capacitors constant. Alternately, the capacitance value of the capacitors on the back surface can be doubled to provide the same amount of total de-coupling capacitance on the module. Another embodiment simply deletes the capacitors on the front surface without enlarging the capacitance value of the back-surface capacitors. Resistor packs can be consolidated on the back surface as well.

The module's substrate must provide sufficient vias or through-holes to connect the power-supply pins of the SRAM chips and capacitors on the back surface to the power-supply pins of the SRAM chips on the front surface. Likewise, vias are needed to connect ground pins of the SRAM chips and capacitors mounted on the back surface with the ground pins of the SRAM chips on the front surface. If such vias were not provided, then the front-surface SRAM chips would not have the capacitors near enough to their power-supply and ground pins and insufficient de-coupling would result. However, multi-layer substrates typically have a separate ground layer or plane and another power layer. These layers are usually embedded within the substrates laminated layers and not one of the two surface layers. Thus many vias are provided to both surfaces from the power and ground layers inside the substrate.

A capacitor mounted on the back surface is only the thickness of the substrate away from the front surface. The small thickness (less than ⅛-th of an inch) of the substrate allows a capacitor on the back surface to still be sufficiently close to a SRAM mounted on the front surface to provide effective de-coupling. Thus capacitors for de-coupling SRAM chips on the front surface can be mounted on the back surface. A single placement sequence can attach all capacitors to the back surface of the module, yet these capacitors can provide de-coupling for SRAMs mounted on both surfaces.

Capacitors are mounted on the back surface rather than on the front surface due to the large size of the processor BGA package. Additionally, the bus-interface chip is mounted on the back surface, and de-coupling capacitors for the bus-interface chip are also mounted nearby on the back surface.

FIG. 2 is a diagram of a processor and cache module with all the capacitors mounted on the back surface. SRAM chips 20, 22 are surface-mounted on the back surface while SRAM chips 40, 42 are surface-mounted on the front surface of the module. Capacitors 30 are mounted to the back surface. Other passive components are also mounted to the back surface, such as resistors 38 used to dampen ringing caused by high-drive signals. No capacitors are mounted to the front surface of the module, so only one placement sequence is needed to mount components to the front surface. Two placement sequences are needed for mounting components to the back surface. Thus, a total of three placement sequences are needed.

Capacitors 30 used for SRAM de-coupling are in close proximity to SRAM chip 20, 22 on the back surface and to SRAM chip 40, 42 on the front surface. Thus capacitors 30 provide de-coupling of current spikes from either of SRAM chips 20, 40. Capacitors 32 are closest to SRAM chips 22, 42 on the back and front surfaces respectively, so capacitors 32 provide de-coupling to SRAM chips 22, 42.

Multiple capacitors are used for de-coupling each of the pairs of SRAM chips because SRAM chips 20, 40 are wide SRAMs such as 32-bit-wide 32K×32 SRAM chips. The thirty-two data outputs are spread out over the perimeter of the SRAM chips and require several ground and power pins. Thus de-coupling is required at several locations around the perimeter of SRAM chips 20, 22, 40, 42 and multiple de-coupling capacitors are employed. Multiple capacitors provide additional de-coupling than provided by a single capacitor. These capacitors typically have a value of 0.1 $\mu$F.

Resistors 30 are packaged together as resistor packs each containing multiple resistors. Resistor packs use less area than separate resistors. Higher-density resistor packs can be used to reduce the area required on the back surface for all the resistor packs. Additional capacitors 36 are used for de-coupling bus-interface chip 19 and for filtering some of the signal traces on substrate 10. A ball-grid-array BGA package for processor 17 has several capacitors 37 built-in to the BGA package itself to provide de-coupling for the processor chip. Notches 4, holes 6, and contact pads 8 provide similar functions as to those described for FIG. 1.

Multiple Banks on a Module—FIG. 3

FIG. 3 is a schematic diagram of a dual-bank-cache processor module. The first bank, "BANK 0", has two SRAM chips 20, 22, each connected to a single data bit (D0 through D63) of data bus 56. The second bank, "BANK 1", also has two SRAM chips 40, 42, each connected to a single data bit (D0 through D63) of data bus 56. Thus, each data bit of the sixty-four-bit data bus 56 is connected to two SRAM chips. For example, data bit D0 is connected to the data I/O pin of SRAM chip 20 of bank 0 and SRAM chip 40 of bank 1. SRAM chips 20, 22, 40, 42 are each a 1M SRAM chip organized as 32K×32-bits.

Control bus 54 includes write-enable WE and address signals to all SRAM chips in both banks. For 32K×32 SRAM chips, twelve address lines are used. The module may include a small decoder (not shown) which uses one address signal (which is not sent over control bus 54) to activate either chip-enable CE0 50 or chip-enable CE1 52 when the cache is accessed. Alternately, bus-interface chip 19 or processor 17 may supply two separate chip-enable signals CE0 50 and CE1 52 to the module.

Data that is not found in either bank of the cache memory of SRAM chips 20, 22, 40, 42 has to be fetched from the main memory external to the processor module. Bus-interface chip 19 detects when an address request misses in the cache and generates an external bus cycle to the off-module main memory (not shown).

CE0 50 is asserted when bank 0 is accessed, while CE1 52 is asserted when bank 1 is accessed. Both CE0 and CE1 are not asserted at the same time. CE0 50 causes both SRAM chips 20, 22, of bank 0 to a drive 64 data bits to data bus 56 on a read when WE is inactive, or to write in the data on data bus 56 when WE is active during a write cycle. CE1 52 performs the similar function for SRAM chips 40, 42, of bank 1.

Multiple Banks Can Share Capacitors

The inventors have also realized that modules with two or more banks of SRAMs can share capacitors since only one bank is being accessed at any one time. When the first bank is being read, the second bank is idle. When the second bank is read, the first bank is idle. Only the first bank of SRAM is generating current spikes which require de-coupling. The second bank requires no de-coupling while the first bank is being read. Both banks cannot be read simultaneously since they share a data bus and a bus conflict results if both banks were to drive the data bus at the same instant.

The module of FIG. 2 can be used where SRAM chips 20, 22, mounted on the back surface are in one bank, while SRAM chips 40, 42, mounted on the front surface are in a second bank. Thus, either the back-surface SRAM chips or the front-surface SRAM chips are being accessed at any given time. Only one set of capacitors is needed since only one bank can be accessed at any time. Capacitors 30, 32, mounted on the back surface provide de-coupling for back-surface SRAMs when chip-enable CE0 and bank 0 is accessed, while the same capacitors provide de-coupling for front-surface SRAMs when chip-enable CE1 and bank 1 is accessed.

Figure 4:
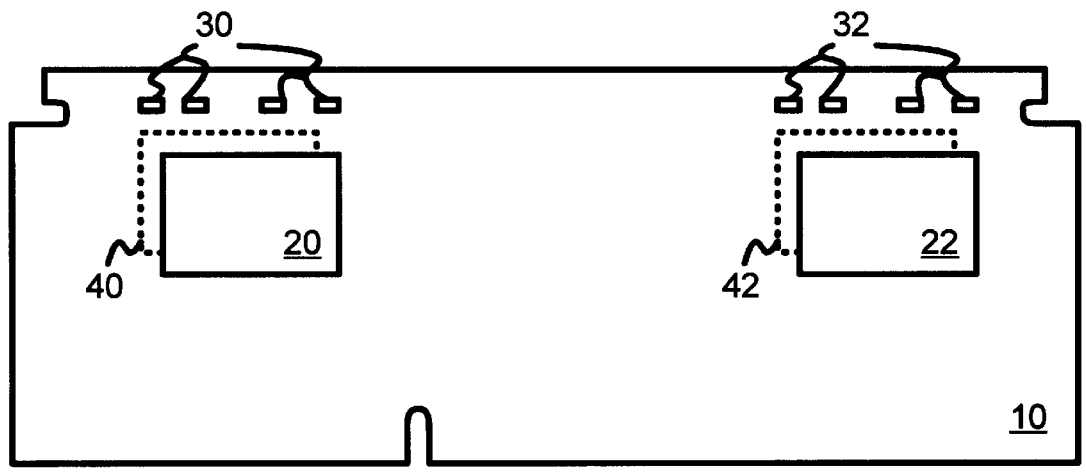
FIG. 4 is a close-up diagram of a portion of a module having pairs of opposing SRAM chips from two banks sharing capacitors.

Opposing Sram Chips Share Capacitors—FIG. 4

FIG. 4 is a close-up diagram of a portion of a module having pairs of opposing SRAM chips from two banks sharing capacitors. SRAM chips 20, 22, are mounted on the back surface of substrate 10 while SRAM chips 40, 42, are mounted on the opposing surface, the front side of substrate 10.

The first bank includes SRAM chips 20, 22, mounted on the back surface, while the second bank includes SRAM chips 40, 42, mounted on the front surface. The first bank is accessed when CE0 is asserted, while the second bank is asserted when CE1 is asserted. CE0 can be routed to SRAM chips 20, 22, using wiring traces on the back surface, while CE1 can be routed to SRAM chips 40, 42, using wiring traces on the front surface. While some cross-under routing may be needed for CE0 or CE1, mounting all SRAM chips from one bank on the same surface simplifies chip-enable interconnect routing. Access delay, a critical parameter, is thus kept small.

Capacitors 30, 32, 36 are all mounted on the back surface of substrate 10. As can be seen in FIG. 4, capacitors 30 are in close proximity to SRAM chip 20 on the same back surface of substrate 10. Capacitors 30 are also in close proximity to SRAM chip 40 mounted on the front surface since SRAM chip 40 is mounted opposite SRAM chip 20. Several vias or through holes are needed to connect the power-supply and ground pins of SRAM chip 40 to capacitors 30, but multilayer boards often already have many vias to connect an internal ground or power-supply plane to the surface pins. Thus the frequent interconnect of power and ground through substrate 10 is already present on many modules.

FIG. 4 shows that SRAM chip 40 is mounted approximately opposite of SRAM chip 20. SRAM chips 20, 40 do not have to be mounted exactly opposite each other. As shown, there is an overlap of the two SRAM chips. A smaller overlap is possible, and even no overlap is contemplated on some layouts, although the overlap is preferred as capacitors 30 can then be closer to both SRAM chip's power and ground pins.

Other opposing SRAM chips share capacitors. SRAM chips 22, 42 share capacitors 32. In the preferred embodiment, the two SRAM chips in the opposing pair both drive the same 32 data bits, but at different times since the two chips are in two different banks, controlled by two different chip-enable signals. The two chips in the opposing pair could drive different data bits, although the wiring length of the data-bit traces then increases, increasing delay slightly.

Figure 5:
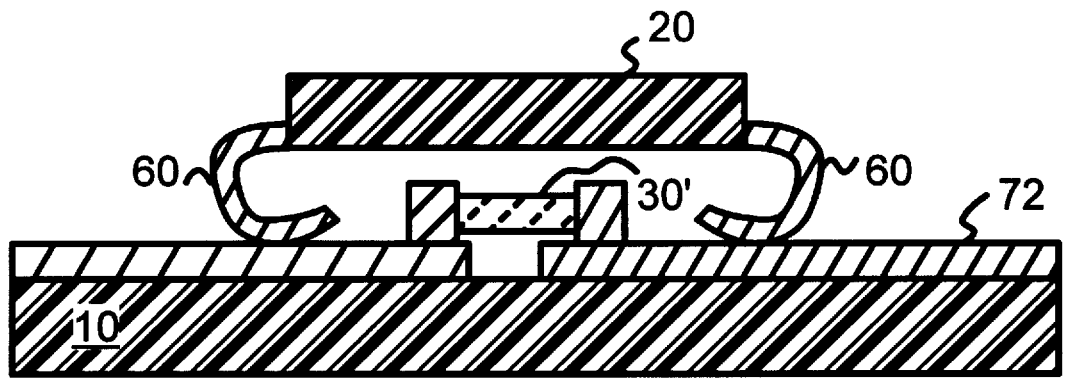
FIG. 5 is a cross-sectional diagram of an SRAM chip with a de-coupling capacitor mounted underneath the SRAM chip.

Capacitors Mounted Under Sram Chips—FIG. 5

FIG. 5 is a cross-sectional diagram of an SRAM chip with a de-coupling capacitor mounted underneath the SRAM chip. The examples have shown surface-mounted capacitors that are mounted adjacent to SRAM chips. Some types of SRAM packages have sufficient clearance underneath between the bottom the of plastic package and the surface of the module's substrate. Some surface-mount SRAMs have enough clearance to mount a capacitor underneath the SRAM chip. Mounting capacitors under the SRAM chips saves area on the substrate and allows the capacitor to be even closer to the power-supply and ground pins of the SRAM chip being decoupled, which is typically the SRAM chip above the capacitor. Multiple capacitors (not shown) can be mounted under each SRAM chip.

SRAM chip 20 has pins that are J-leads 60. J-leads 60 are soldered to metal areas of bonding on top-metal layer 72 on the surface of substrate 10 to make electrical connection. Capacitor 30' is also soldered to metal interconnect areas on the top surface of substrate 10 to make electrical connection. Two separate placement sequences are typically needed to mount capacitor 30' under SRAM chip 20.

Since J-leads 60 have a relatively high profile while surface-mount capacitor 30' has a lower profile, capacitor 30' may be mounted under SRAM chip 20. Thus, the capacitors shown in earlier Figures and examples could be mounted directly under one of the SRAM chips rather than next to the SRAM chip. Other kinds of leads such as gull-wing leads may also provide sufficient clearance for mounting thinner capacitors.

Figure 6:
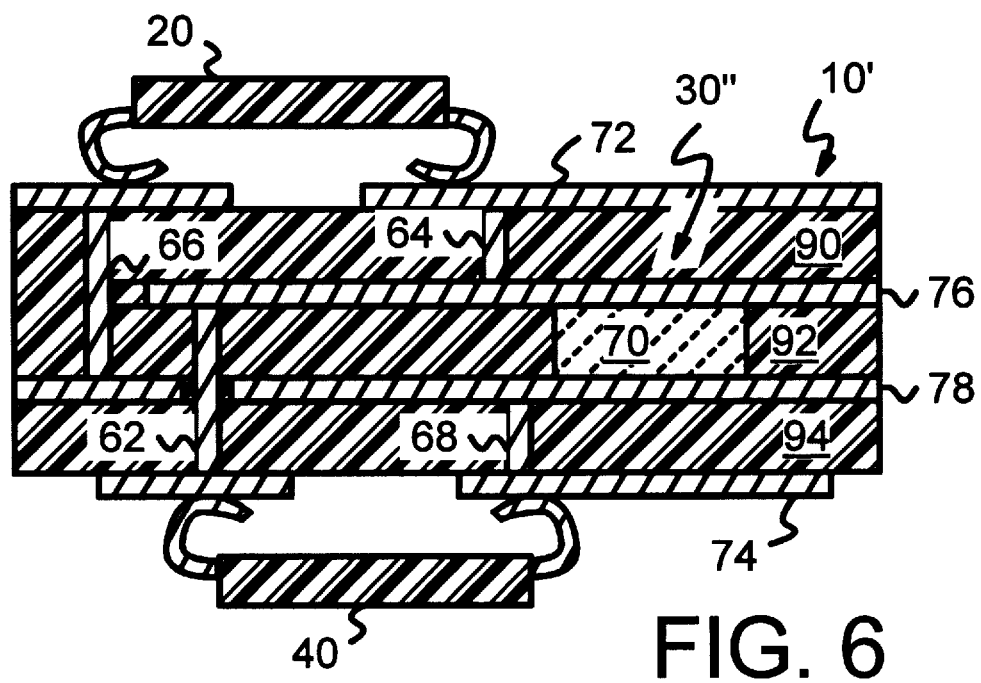
FIG. 6 is a cross-sectional diagram of a module where the de-coupling capacitors are an integral part of the substrate material itself.

Capacitor Inside Multi-Layer Substrate—FIG. 6

FIG. 6 is a cross-sectional diagram of a module where the de-coupling capacitors are an integral part of the substrate material itself. Substrate 10' is a multi-layer printed-circuit board or other material having a laminate of insulating fiberglass layers 90, 92, 94 sandwiched between four metal layers 72, 74, 76, 78. Top metal layer 72 is on the top surface of substrate 10', while bottom metal layer 74 is on the bottom surface of substrate 10'.

Top metal layer 72 and bottom metal layer 74 are patterned to form traces for signal interconnect and bonding or soldering pads which are wide enough for soldering and bonding with the pins of SRAM chips. Interior metal layers 76, 78 are used for power and ground routing and are sometimes called the power and ground plane since these layers are often largely unpatterned sheets rather than small traces. Metal layer 76 is the power-supply layer while metal layer 78 is the ground layer.

A capacitor can be formed by forming a slug 70 of high-dielectric-constant material between the power and ground layers 76, 78. Where power metal layer 76 contacts slug 70, the top plate of the capacitor is formed, and where ground metal layer 78 contacts slug 70, the bottom plate of the capacitor is formed. Thus slug 70 forms a parallel-plate capacitor with metal layers 76, 78.

Since the capacitance value is proportional to the thickness of slug 70, a cutout in insulating layer 92 can be made for slug 70 so that slug 70 can be thinner than insulating layer 92. Metal plates in addition to metal layers 76, 78 can be fashioned directly onto slug 70 to decrease the thickness of the capacitor.

The pins of SRAM chip 20 are soldered to top metal layer 72 while SRAM chip 40 has its pins soldered to bottom metal layer 74. Via 66 is formed to electrically connect the ground pin of SRAM chip 20 to ground metal layer 78 while via 64 is formed to electrically connect the power pin of SRAM chip 20 to power metal layer 76. Likewise, via 68 is formed to electrically connect the ground pin of SRAM chip 40 to ground metal layer 78 while via 62 is formed to electrically connect the power pin of SRAM chip 40 to power metal layer 76. Thus vias 62, 64, 66, 68 provide connecting from the power and ground pins of SRAM chips 20, 40 to power and ground metal layers 76, 78 which is connected to slug 70 which forms capacitor 30".

Capacitor 30" performs de-coupling for SRAM chips 20, 40 as did the surface-mounted capacitor 30 of FIGS. 2 and 4. Since SRAM chip 20 is activated by CE0 of the first bank while SRAM chip 40 is activated by CE1 of the second bank, only one of SRAM chips 20, 40 is actively driving data at any time. Thus, a single capacitor 30" can be shared by SRAM chip 20 on the top surface and SRAM chip 40 on the bottom surface.

Many types of embedded capacitors and methods for making them are known. See U.S. Pat. Nos. 5,161,086, 4,878,155, 5,261,153, 5,172,304, RE 35,064, and 5,469,324 for embedded capacitors.

Other passive components may also be integrated inside the substrate. U.S. Pat. No. 4,870,746 is an example of a resistor formed on layers inside a multi-layer board. Resistors are often used to dampen ringing, or as termination. Both capacitors and resistors can be integrated inside the substrate. Integrating resistors and capacitors into the substrate layers allows the elimination of surface-mounted resistors and capacitors, thus eliminating a placement sequence, reducing cost.

Advantages of the Invention

Capacitors are mounted on just one of the surfaces of the module, rather than on both surfaces. The invention reduces by one the number of placement sequences, reducing the time spent by soldering equipment, thus reducing cost. About one second per processor module is saved by placing all capacitors on one rather than two sides of the module. Since the total time on the manufacturing machine is about 10 seconds, this is a significant saving. Integrating resistors and capacitors into the substrate layers allows the elimination of surface-mounted resistors and capacitors, thus eliminating a placement sequence, reducing cost.

Capacitors can be shared among a pair of SRAM chips when the SRAM chips are both close to the shared capacitor. Sharing capacitors reduces the number of components required and the amount of time for manufacturing equipment to place the components onto the substrate. Thus sharing capacitors reduces cost as well as conserving the surface area of the module.

The pair of SRAM chips sharing a capacitor can be from different banks of SRAMs. Since only one of the banks of SRAMs is accessed at any time, only one of the SRAM chips in the pair of SRAM chips can generate a current spike requiring de-coupling from the shared capacitor. Thus, the invention takes advantage of the electrical configuration of a module to reduce the number of components and the cost of the module.

Alternate Embodiments

Several other embodiments are contemplated by the inventors. For example, the number of SRAM chips and capacitors on each side of the substrate can be varied. Wider or narrower SRAM chips may be substituted. A single capacitor can be shared for a pair of multi-bit SRAM chips, although the value of the capacitor may need to be increased. The examples have used a processor with a 64-bit data bus, although narrower 32-bit or wider 128-bit modules are possible. Other kinds of Integrated Circuits (IC's) can be mounted, such as an address or bank decoder. The data bus may be expanded for parity or error-correction bits.

Future processor modules may use memory chips other than standard SRAMs, or improved SRAMs such as synchronous or clocked SRAMs. Additional control signals such as strobes or clocks may be added. Modules with three or more banks of SRAMs can share a capacitor among three or more SRAM chips, one for each bank. The processor module finds its greatest application in personal computers (PC's) compatible with the IBM-AT. The terms "back surface" and "front surface" are arbitrarily assigned as shown in the Figures and each term could refer to either surface of the module in relation to the notch. Vias of through-holes provide electrical connection between the surfaces or intermediate layers. These through-holes could be filled in holes or metal traces between layers rather than open holes.

Rather than have all of one SRAM bank on one surface and all of the second SRAM bank on the other surface, some of the SRAM chips from one bank could be swapped with the SRAM chips on the opposite surface. For example, the module of FIG. 4 could be modified by swapping SRAM chips 22, 42 so that SRAM chip 22 is mounted on the front surface while SRAM chip 42 is now mounted on the back surface. The back surface then has SRAM chip 20 from the first bank and SRAM chip 42 from the second bank. SRAM chips 22, 42 still share capacitors 32, even though the SRAM chips have been reversed. Thus capacitors are still shared between SRAM chips from two banks, but each surface contains SRAM chips from both banks. Of course, the chip-enable signal has to be routed through to the opposite surface when the banks are spread over both surfaces.

A single-sided module may be constructed by placing both banks on the same surface, but arranging the SRAMs into adjacent pairs of SRAM chips from the two banks so that a single capacitor can be shared. Another alternative is to mount SRAM chips on both surfaces in adjacent pairs, but mount capacitors only on one surface. The shared capacitors are mounted on the back surface even for adjacent pairs of SRAM chips mounted on the front surface. A four-bank, double-sided module could be constructed with two adjacent SRAM chips on the back surface for the first two banks, and two more SRAM chips on the front surface for the third and fourth banks. A single set of capacitors can be shared by four the SRAM chips, since each SRAM chips is part of a different bank. Only one of the four SRAM chips is active at any one time. Thus a single group of capacitors can be shared among an adjacent pair of a pair of opposing SRAM chips, four SRAM chips in all. Adjacent pairs are less desirable than opposing pairs, since the average distance from the shared capacitor to the power-supply and ground pins of the two SRAM chips is usually larger for adjacent pairs than for opposing pairs.

Capacitors have been described as providing de-coupling of current spikes from the nearest SRAM chips. This is an approximation, since all the capacitors are connected to power and ground, which are common to all SRAM chips. Thus in a strict sense, each capacitor provides de-coupling for all SRAM chips in the module. However, the larger distances from a capacitor to more remote SRAM chips increases the R-C delay of the power and ground traces, delaying the de-coupling of the capacitor to remote SRAM chips. Thus, remote SRAM chips are supplied current from nearby capacitors more quickly than from father-away capacitors. It is thought than most of the complementary current to cancel a current spike generated by a SRAM chip comes from the nearest capacitor to the pins of the SRAM chip.

Multi-layer printed circuit board (PCB) substrates can share the power and ground planes with signal traces to reduce the number of layers used from 6 layers to 4 layers. ASIC chips can be added to enhance the modules. Many other configurations are possible.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A dual-bank processor module with a cache memory and shared capacitors comprising:
   a substrate having wiring traces for conducting signals, the substrate also having power-supply traces and ground traces for connection to a power supply voltage and a ground voltage;
   a processor chip, mounted on the substrate, for generating addresses for fetching data and instructions;
   a plurality of leads along a bottom edge of the substrate, the plurality of leads including a power-supply lead and a ground lead and control leads and data leads, the plurality of leads for electrically connecting the dual-bank processor module to a system, the control leads and data leads for fetching data and instructions not found in the cache memory on the substrate; and
   the cache memory having pairs of static random-access-memory SRAM chips mounted on the substrate, each pair having a first SRAM chip from a first bank and a second SRAM chip from a second bank, each pair of SRAM chips sharing a capacitor coupled between power-supply and ground pins of the first and second SRAM chips,
   whereby each pair of SRAM chips share a capacitor.

2. The dual-bank processor module of claim 1 wherein all capacitors are mounted on a first surface of the substrate and no capacitors are mounted on a second surface of the substrate, the second surface opposite the first surface.

3. The dual-bank processor module of claim 2 wherein the processor chip further comprises processor-de-coupling capacitors formed in a processor package for the processor chip, the processor package mounted on the second surface.

4. The dual-bank processor module of claim 3 wherein the processor package is a ball-grid-array BGA package having solder balls for connection to the substrate.

5. The dual-bank processor module of claim 2 wherein each pair of SRAM chips includes the first SRAM chip mounted on the first surface of the substrate and the second SRAM chip mounted on the second surface of the substrate,
   whereby the SRAM chips in a pair are mounted on opposite surfaces of the substrate.

6. The dual-bank processor module of claim 5 wherein the first SRAM chip is mounted opposite the second SRAM chip, the first SRAM chip on the first surface overlapping a portion of the second SRAM chip on the second surface, the substrate having an overlapping portion having the first surface with the first SRAM chip mounted thereon and the second surface with a portion of the second SRAM chip mounted thereon.

7. The dual-bank processor module of claim 2 wherein control leads from the processor chip to the cache memory include a first chip-enable signal and a second chip-enable signal, the first chip-enable signal connected to all SRAM chips in the first bank and not connected to any SRAM chips in the second bank, while the second chip-enable signal is connected to all SRAM chips in the second bank and is not connected to any SRAM chips in the first bank,
   wherein the first SRAM chip is controlled by the first chip-enable signal and the second SRAM chip is controlled by the second chip-enable signal,
   whereby the first bank and the second bank of SRAMs are separately controlled.

8. The dual-bank processor module of claim 7 wherein the first SRAM chip and the second SRAM chip in the pair of SRAM chips both are coupled to a same group of data signals in data leads from the processor chip, the same group of data signals not connected to other SRAM chips in the dual-bank processor module,
   whereby each pair of SRAM chips is coupled to a unique group of data signals.

9. The dual-bank processor module of claim 8 further comprising:
   a notch in the substrate for locking the dual-bank processor module in a socket;
   a heat sink;
   holes in the substrate for mounting the heat sink to the substrate, the heat sink thermally connected to the processor chip;
   whereby the dual-bank processor module is interchangeable with other processor modules.

10. The dual-bank processor module of claim 4 further comprising:
    a through-hole in the substrate for each pair of SRAM chips, the through-hole being near the capacitor, the through-hole for connecting the capacitor to the ground pin of the first SRAM chip and to the ground pin of the second SRAM chip,
    whereby each pair of SRAM chips has a through-hole in the substrate for local connection of ground voltage to the capacitor.

11. The dual-bank processor module of claim 10 wherein the capacitor is mounted under the first SRAM chip.

12. The dual-bank processor module of claim 10 wherein the capacitor is mounted adjacent to the first SRAM chip.

13. The dual-bank processor module of claim 10 wherein the capacitor is formed inside the substrate nearer to the first SRAM chip and to the second SRAM chip than to other SRAM chips in other pairs of SRAM chips.

14. The dual-bank processor module of claim 10 wherein the substrate having wiring traces for conducting signals comprises:

a four-layer printed circuit board (PCB), wherein the power-supply traces and the ground traces are each in a layer which also contains conducting signals, whereby cost is reduced by sharing power and ground layers with the conducting signals.

15. The dual-bank processor module of claim 14 wherein the plurality of leads along the bottom edge comprise a single-edge-cartridge connector.

16. The dual-bank processor module of claim 15 wherein the SRAM chips comprise synchronous SRAM chips.

17. The dual-bank processor module of claim 16 further comprising:

dampening resistors mounted on the first surface of the substrate, wherein no resistors are mounted on the second surface of the substrate, the second surface opposite the first surface, whereby resistors are mounted on only one surface of the substrate.

18. A dual-sided, multi-bank processor module comprising:

a substrate for making electrical connection between memory chips mounted on a first surface and on a second surface of the substrate;

a processor chip, mounted on the substrate, for generating addresses of data and instructions requested from a cache memory or a main memory;

a bus-interface chip, mounted on the substrate and coupled to the processor chip, for controlling a cache-data bus to the processor chip and a main-memory bus;

a plurality of external connecting leads on the substrate, the plurality of external connecting leads for connecting to the main memory in a host system, the plurality of connecting leads including data leads and control leads for the main-memory bus controlled by the bus-interface chip;

a plurality of shared capacitors for suppressing current spikes, the plurality of capacitors mounted on the first surface but not mounted on the second surface of the substrate;

a first bank of memory chips for storing data, the first bank having first memory chips mounted on the substrate, the first bank driving data onto all data bits of the cache-data bus;

a second bank of memory chips for storing data, the second bank having second memory chips mounted on the substrate, the second bank driving data onto all data bits of the cache-data bus;

wherein the first and the second bank drive the same data bits of the cache-data bus but are controlled by the bus-interface chip to not drive data simultaneously;

the plurality of capacitors, the first bank, and the second bank being arranged on the substrate into local groups, each local group having a first memory chip from the first bank and a second memory chip from the second bank and local capacitors, the local capacitors physically located closer to the first and second memory chips in the local group than to other memory chips, whereby the local capacitors in each local group suppressing current spikes generated by the memory chips in the local group when the data in either the first bank or the second bank is accessed.

19. The dual-sided, multi-bank processor module of claim 18 wherein the first memory chip is mounted on a surface of the substrate opposite the second memory chip on a different surface of the substrate.

20. The dual-sided, multi-bank processor module of claim 19 wherein all memory chips in the first bank are mounted on the first surface and all memory chips in the second bank are mounted on the second surface, and wherein the processor chip is mounted on the second surface and the bus-interface chip is mounted on the first surface.

21. The dual-sided, multi-bank processor module of claim 19 wherein the host system is a personal computer (PC).

\* \* \* \* \*